United States Patent [19]
Shafir

[11] Patent Number: 5,298,719
[45] Date of Patent: Mar. 29, 1994

[54] LASER BEAM HEATING METHOD AND APPARATUS

[76] Inventor: Aaron Shafir, 9 Leon Blum Street, 69 461 Tel Aviv, Israel

[21] Appl. No.: 978,580

[22] Filed: Nov. 19, 1992

[51] Int. Cl.⁵ .............................................. B23K 26/06
[52] U.S. Cl. ........................... 219/121.73; 219/121.74; 219/121.78
[58] Field of Search ....................... 219/121.67, 121.72, 219/121.73, 121.24, 121.6, 121.85, 121.63, 121.75, 121.64, 121.74, 121.78

[56] References Cited

U.S. PATENT DOCUMENTS

| | | | |
|---|---|---|---|
| 3,544,165 | 12/1970 | Snedden | 219/121.74 X |
| 3,630,766 | 9/1971 | Kino et al. | 219/349 |
| 3,695,498 | 10/1972 | Dear | 219/347 X |
| 4,518,232 | 5/1985 | Dagenais | 219/121.73 |
| 4,547,650 | 10/1985 | Arditty et al. | 219/121.65 |
| 4,553,017 | 11/1985 | Addleman | 219/121.61 |
| 4,668,869 | 5/1987 | Matosian et al. | 250/493.1 |
| 4,806,728 | 2/1989 | Salzer | 219/121.63 |
| 4,858,090 | 8/1989 | Downs | 362/302 |

Primary Examiner—C. L. Albritton
Attorney, Agent, or Firm—Benjamin J. Barish

[57] ABSTRACT

A method and apparatus for concentrating the heat energy of a laser beam by directing the laser beam to an optical device, such as a planar mirror, located at a first focal point of a reflector having a curved surface approximating that of an ellipsoid. The optical device redirects the laser beam to the curved surface of the reflector which reflects and focusses it to a second focal point of the reflector. The optical device is driven to cause the laser beam to successively scan different portions of the curved surface of the reflector while the latter surface reflects the laser beam substantially to the second focal point where the object to be heated is located.

15 Claims, 2 Drawing Sheets

LASER BEAM HEATING METHOD AND APPARATUS

FIELD AND BACKGROUND OF THE INVENTION

The present invention relates to a method and apparatus for heating by the use of a laser beam. The method and apparatus of the present invention are particularly useful for utilizing a laser beam for cutting purposes, and are therefore described below with respect to this application.

Lasers are now widely used in a large variety of heating or cutting applications, such as surgical scalpels, workpiece cutters, and the like. One of the problems in such heating or cutting applications is to concentrate the heat energy of the laser to predetermined points of the object to be heated without overly heating surrounding portions of the object.

OBJECTS AND BRIEF SUMMARY OF THE INVENTION

An object of the present invention is to provide a method, and also apparatus, for concentrating the heat energy of a laser beam at a predetermined point of an object to be heated, thereby permitting high concentrations of laser energy to be applied to the object without overly heating surrounding portions of the object.

According to the present invention, there is provided a method of concentrating the heat energy of a laser beam at a predetermined point of an object to be heated, comprising: directing the laser beam to an optical device located at a first point with respect to a reflector having a curved surface approximating that of an ellipsoid, the first point being approximately the first focal point of the ellipsoid, the optical device redirecting the laser beam from the first focal point to the curved surface of the reflector to cause the beam to be reflected to a second focal point of the reflector; focussing the laser beam such that it comes substantially to a focus at the second focal point of the reflector; driving the optical device at the first focal point to cause the laser beam to successively scan different portions of the curved surface of the reflector while the latter surface reflects the laser beam substantially to the second focal point; and positioning the object such that its predetermined point to be heated is located substantially at the second focal point.

A characteristic of an elliptical or ellipsoidal reflector is that the sum of the distance from one fixed point (called the first focal point) to a point on the reflector, and the distance from that point on the reflector to a second fixed point (called the second focal point) is constant for all points on the reflector. Thus, if the laser beam is directed to the first focal point and is focussed so as to come to a focus at the second focal point, the laser beam will remain focussed at the second focal point irrespective of the path the beam takes from the first focal point to the second focal point. This characteristic is exploited in the present invention by moving the laser beam from the first focal point to successively scan different surfaces of the elliptical reflector which reflects the laser beam from all such surfaces to the second focal point. This enables the energy to be concentrated at the second focal point while distributing the energy over the reflector, and also over the regions of the object adjacent the second focal point, so as to avoid undue heating of either the reflector or of those adjacent regions.

According to further features in the preferred embodiment of the invention described below, the reflector surface deviates from a true ellipsoidal surface to at least partially compensate for defocussing at the second focal point by refraction of the beam within the object.

According to further features in the described preferred embodiment, relative movement is effected along three orthogonal axes thereby permitting cutting the object in three dimensions.

The present invention also provides apparatus for heating an object by the use of a laser beam in accordance with the above method.

It will thus be seen that the method and apparatus of the present invention enable very high concentrations of laser energy to be applied to any selected predetermined point, lines or surfaces, without unduly heating surrounding portions of the object, or without unduly heating the elliptical reflector, since different surfaces of the reflector are scanned while the laser energy reflected thereby is concentrated at the predetermined point. Such method and apparatus may therefore be used for applying high-intensity laser energy to selected points below the surface of a three-dimensional object. Possible applications for such method and apparatus would therefore include use as a surgical scalpel for cutting or burning tissue within the body without making an incision, cutting a three-dimensional contour of a model or part, heating or cutting multi-layer patterns in an object such as a printed circuit board or integrated-circuit wafer, and the like.

Further features, advantages and applications of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
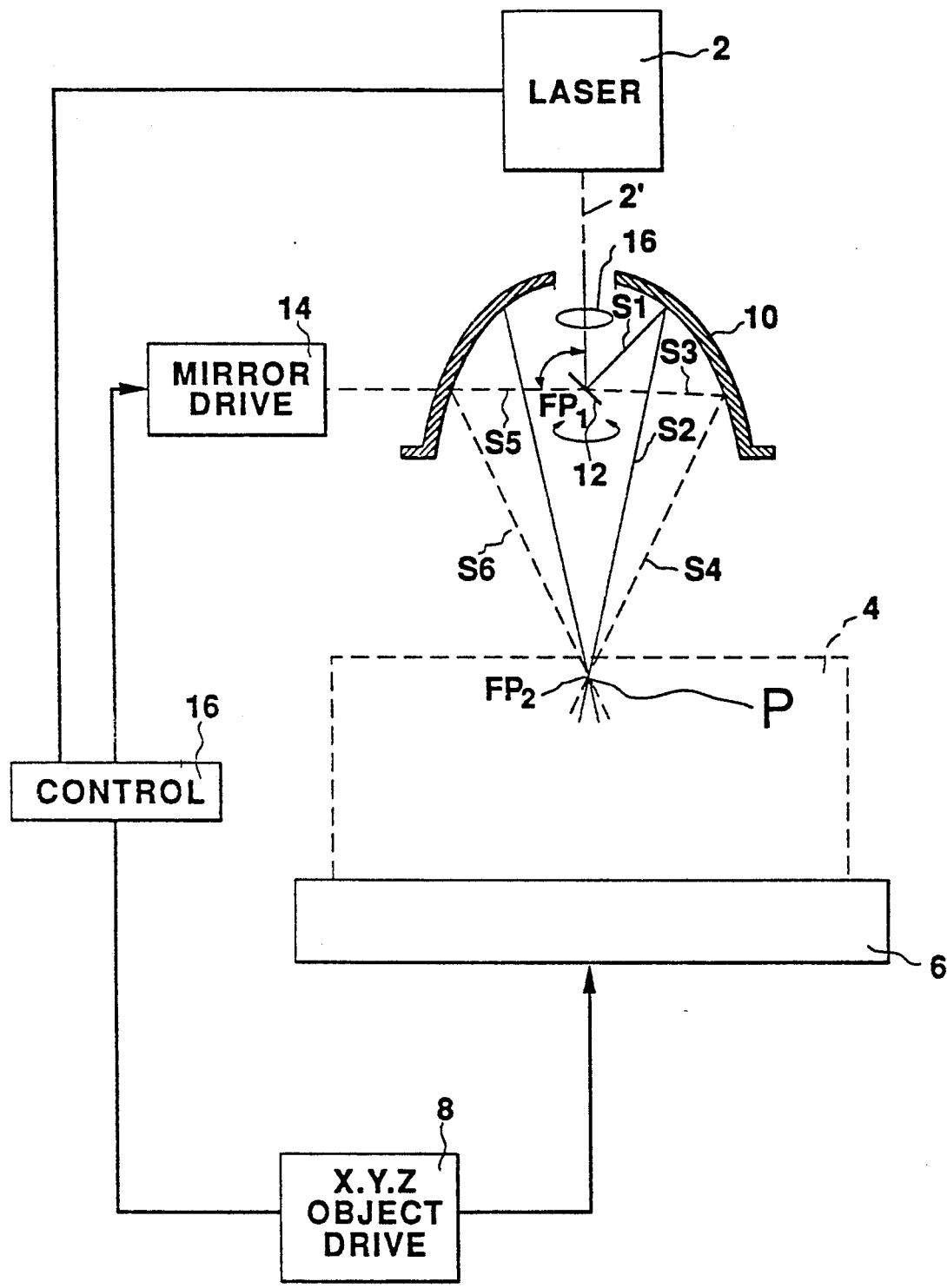
FIG. 1 diagrammatically illustrates one form of apparatus constructed and operating in accordance with the present invention.

FIG. 1 illustrates one form of apparatus using a laser 2 for heating a predetermined point P in an object 4 with a high concentration of heat energy without unduly heating surrounding areas of the object 4. As one example, laser 2 may be a surgical laser outputting a laser beam 2' for cutting or burning-away tissue at point P of a subject 4. BY concentrating the laser energy at point P below the outer surface of the subject (object 4), without unduly heating the surrounding area not to be cut or burnt away, it may be possible in many applicatons to perform surgery without actually making an incision into the patient's body. Other possible applications of such laser apparatus would include cutting contours at different thicknesses in a body in order to produce three-dimensional parts or models.

The object 4 to receive the laser beam 2' is supported on a table 6. Table 6 is driven along all three orthogonal axes (X, Y, Z) by an object drive 8 in order to position the object 4 precisely with respect to the laser beam 2'. The apparatus illustrated in FIG. 1 further includes a substantially ellipsoidal reflector 10 having an opening 11 for receiving the laser beam 2'.

The two focal points of reflector 10 are indicated at $FP_1$ and $FP_2$ respectively. As described earlier, a characteristic of an elliptical surface is that the sum of the distances from its two focal points is constant. Thus, in the diagram of FIG. 1, $S_1+S_2=S_3+S_4=S_5+S_6$, etc.

The apparatus illustrated in FIG. 1 thus includes a planar mirror 12 at the reflector focal point $FP_1$, and a drive 14 for driving the mirror to cause the laser beam reflected thereby to successively scan a large surface area of the ellipsoidal reflector 10. The apparatus further includes a lens 16 which focusses, the laser beam such that it comes to a focus at the reflector focal point $FP_2$. Since the sum of the distances from focal point $FP_1$ to the surface of the ellipsoidal reflector 10 and from that surface to its focal point $FP_2$ is the same for all points on the ellipsoidal reflector, it will be appreciated that the laser beam 2' will come to a focus at point $FP_2$ for all the scanning positions of the laser beam with respect to the reflector.

Figure 3:
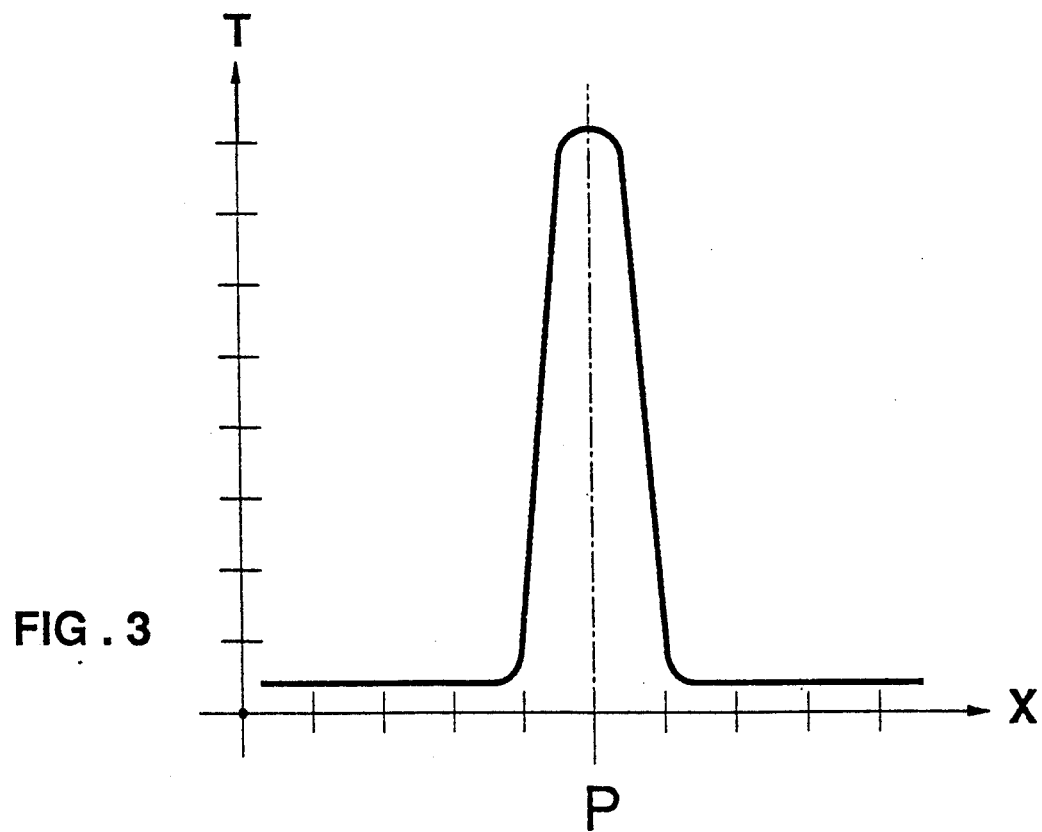
FIG. 3 is a distance/temperature diagram illustrating the manner in which the energy is concentrated in accordance with the method of the present invention at a specified point in the object.

The energy of the laser beam 2' may thus be highly concentrated at focal point $FP_2$ without unduly heating the inner surface of the reflector 10 or without unduly heating neighbouring areas of the object 4 to be heated adjacent the focal point $FP_2$. Accordingly, by positioning the object 4 so that the predetermined point to be heated P coincides with the second focal point $FP_2$ of the ellipsoidal reflector 10, the heat energy of the laser beam can be highly concentrated at the predetermined heating point P without unduly heating other parts of the object 4. This is more clearly illustrated in the diagram of FIG. 3, wherein it will be seen that the heat is concentrated at point P so that the temperature (T) at this point comes to a peak.

Reflector 10 would be perfectly ellipsoidal in an idealized system wherein the index of refraction of object 4 is the same as that of air so that the laser beam, when entering the object 4, will not be refracted. However, in a practical system, this will not be the case, and therefore the laser beam entering the object 4 will be refracted according to the index of refraction of the material of object 4. This refraction of the laser beam tends to blur the concentration of the laser energy at the focal point $FP_2$.

For this reason, it is preferable to have the inner surface of reflector 10 deviate from a true ellipsoidal surface to at least partially compensate for defocussing at the second focal point $FP_2$ by the refraction of the laser beam within the object 4. Another way of minimizing this blurring effect at the second focal point is to provide a compensating lens system, e.g., for lens 16, which compensates for this defocussing effect caused by refraction.

The system illustrated in FIG. 1 further includes a control unit 16 which controls the laser 2, the object drive 8, and the mirror drive 14. The control of laser 2 can be such as to produce either pulsed outputs from the laser, or continuous outputs, as required for any particular application. The control of the mirror drive can be such as to cause the laser beam to scan substantially the complete inner surface of the ellipsoidal reflector 10 and thus to spread its energy over a wide area not only with respect to the reflector 10, but also with respect to the areas of the object 4 surrounding the point P to be heated.

Figure 2:
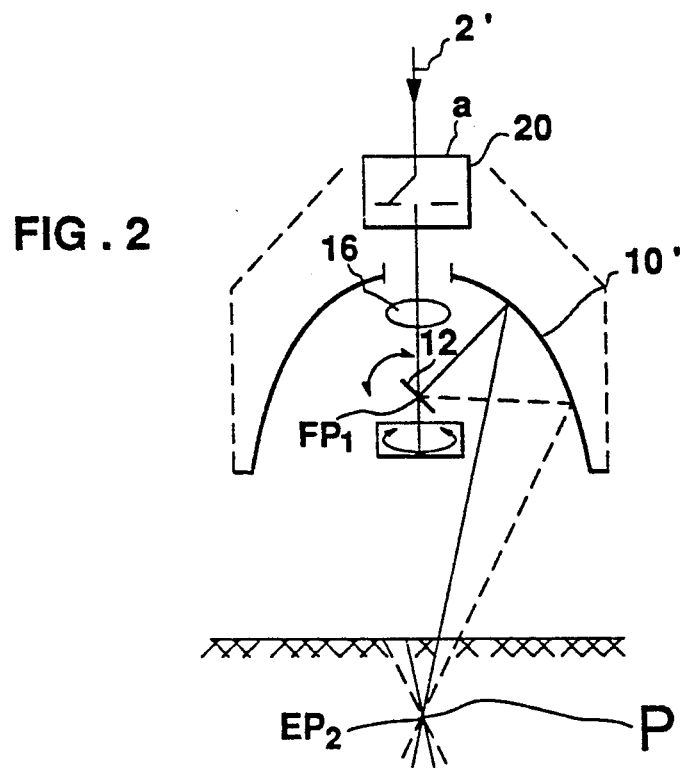
FIG. 2 illustrates a modification in the apparatus of FIG. 1.

FIG. 2 illustrates a variation including a shutter 20, which would also be controlled by the control system 16 (FIG. 1) to block the laser beam from the reflector 10 and object 4 when cutting is not desired. In all other respects, the apparatus in FIG. 2 is constructed and operates in the same manner as described above with respect to FIG. 1.

The apparatus as illustrated in FIGS. 1 and 2 lends itself to CAD (computer aided design) and CAM (computer aided manufacture). Thus, three-dimensional models can be constructed by moving table 6 along the X and Y axes while controlling laser 2 to trace the contour of a horizontal slice of the three-dimensional model to be constructed, and then moving the table along the Z axis to trace the contour of another horizontal slice, until the complete three-dimensional model has been cut. After the complete three-dimensional model has been thus cut within the center of the workpiece, the outer margins of the workpiece can then be cut along a plurality of vertical planes radiating from the center and extending from the outer edges of the workpiece to the cut contour lines of the model, so that the outer edges will fall away or can be easily removed, thereby leaving the three-dimensional model.

The illustrated apparatus also lends itself for use as a surgical laser for cutting or burning away internal tissue without making an incision. Another possible application is in producing multi-layered patterns in printed circuit boards or integrated-circuit wafers.

Many other variations and applications of the invention will be apparent.

What is claimed is:

1. A method of concentrating the heat energy of a laser beam at a predetermined point of an object to be heated, comprising:

directing the laser beam to an optical device located at a first point with respect to a reflector having a curved surface approximating that of an ellipsoid, said first point being approximately the first focal point of the ellipsoid, said optical device redirecting the laser beam from said first focal point to said curved surface of the reflector to cause the beam to be reflected to a second focal point of the reflector;

focussing the laser beam such that it comes substantially to a focus at said second focal point of the reflector;

driving said optical device at said first focal point to cause the laser beam to successively scan different portions of said curved surface of the reflector while the latter surface reflects the laser beam substantially to said second focal point;

and positioning the object such that its predetermined point to be heated is located substantially at said second focal point.

2. The method according to claim 1, wherein said optical device is a planar mirror.

3. The method according to claim 2, wherein the laser beam has sufficient energy such that said predetermined point of the object is heated to vaporize the material thereat.

4. The method according to claim 3, wherein relative movement is effected along at least one orthogonal axis between the object and the reflector such that the object is cut along a line defined by said orthogonal axis.

5. The method according to claim 4, wherein said relative movement is effected along three orthogonal axes such that the object is cut in three dimensions.

6. The method according to claim 1, further including selectively interrupting the laser beam to control the points of heating of the object.

7. The method according to claim 1, wherein said reflector surface deviates from a true ellipsoidal surface to at least partially compensate for defocussing of the laser beam at said second focal point by refraction of the laser beam as it passes through the object.

8. Apparatus for heating a predetermined point of an object, comprising:
- a laser producing a high-energy laser beam;
- a reflector formed with a curved surface approximating that of an ellipsoid and having first and second focal points;
- an optical device at said first focal point of the reflector effective to redirect the laser beam from said first focal point to the reflector from where it is reflected to the second focal point of the reflector;
- means for focussing the laser beam such that it comes to a focus at said second focal point of the ellipsoidal surface;
- a drive for driving said optical device at said first focal point to cause the laser beam to successively scan different portions of said ellipsoidal surface of the reflector while the latter surface reflects the laser beam substantially to said second focal point;
- and means for positioning an object such that its predetermined point to be heated is located substantially at said second focal point.

9. The apparatus according to claim 8, wherein said optical device is a planar mirror.

10. The apparatus according to claim 9, wherein said laser outputs sufficient energy to vaporize the material at said second focal point.

11. The apparatus according to claim 8, including a second drive for effecting relative movement along at least one orthogonal axis between the object and the second focal point of the reflector such that the object is cut along a line defined by said orthogonal axis.

12. The apparatus according to claim 11, wherein said second drive effects relative movement along three orthogonal axis.

13. The apparatus according to claim 12, further including a shutter between said laser and said reflector for selectively interrupting the laser beam.

14. The apparatus according to claim 12, including a controller for controlling said optical device drive, said second drive, and said laser.

15. The apparatus according to claim 8, wherein said reflector surface deviates from a true ellipsoidal surface to at least partially compensate for defocussing of the laser beam at said second focal point by refraction of the laser beam as it passes through the object.

* * * * *